United States Patent
Nallam

(10) Patent No.: US 11,923,849 B1
(45) Date of Patent: Mar. 5, 2024

(54) FREQUENCY DIVIDER FOR NON-OVERLAPPING CLOCK SIGNALS

(71) Applicant: QUALCOMM Incorporated, San Diego, CA (US)

(72) Inventor: Nagarjuna Nallam, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/899,564

(22) Filed: Aug. 30, 2022

(51) Int. Cl.
H03K 21/00 (2006.01)
H03K 3/0233 (2006.01)
H03K 21/02 (2006.01)
H03K 21/10 (2006.01)
H03K 23/42 (2006.01)
H03K 23/54 (2006.01)
H03K 19/20 (2006.01)

(52) U.S. Cl.
CPC .......... *H03K 21/026* (2013.01); *H03K 3/0233* (2013.01); *H03K 21/023* (2013.01); *H03K 21/10* (2013.01); *H03K 23/425* (2013.01); *H03K 23/54* (2013.01); *H03K 19/20* (2013.01)

(58) Field of Classification Search
CPC .... H03K 21/026; H03K 21/10; H03K 21/023; H03K 23/425; H03K 23/58; H03K 23/40; H03K 23/50; H03K 23/588; H03K 23/54; H03K 23/542; H03K 23/544
See application file for complete search history.

(56) References Cited

U.S. PATENT DOCUMENTS

| 4,394,769 | A | * | 7/1983 | Lull | ...................... | H03K 23/542 |
| | | | | | | 377/122 |
| 5,528,181 | A | | 6/1996 | Suggs | | |
| 5,633,607 | A | * | 5/1997 | Millar | ................... | H03K 3/037 |
| | | | | | | 327/227 |
| 10,193,539 | B1 | * | 1/2019 | Choi | ...................... | H03K 21/10 |
| 2002/0057117 | A1 | | 5/2002 | Choi et al. | | |
| 2002/0075989 | A1 | * | 6/2002 | Joo | ........................ | H03K 23/50 |
| | | | | | | 377/33 |

(Continued)

OTHER PUBLICATIONS

Thijssen B J., et al., "2.4-GHz Highly Selective IoT Receiver Front End With Power Optimized LNTA, Frequency Divider, and Baseband Analog FIR Filter", IEEE Journal of Solid-State Circuits, vol. 56, Issue: 7, Jul. 2021, 11 Pages, doi: 10.1109/JSSC.2020.3031493.

(Continued)

*Primary Examiner* — Tuan T Lam
(74) *Attorney, Agent, or Firm* — Haynes and Boone, LLP

(57) ABSTRACT

A frequency divider is provided that includes a plurality of latches for dividing an input clock according to an integer frequency divisor N of three or greater. Each latch is coupled to a corresponding pair of logic gates. For each latch, one of the logic gates in the corresponding pair controls a setting of the latch whereas a remaining one of the logic gates in the corresponding pair controls a resetting of the latch. Each latch outputs a pair of overlapping clock signals that are divided in frequency with respect to the input clock and have a 50% duty cycle. Each logic gate processes a pair of the overlapping clock signal and the input clock signal to provide a non-overlapping clock signal of the same frequency of the overlapping clock signals but have a (50/N) % duty cycle.

26 Claims, 10 Drawing Sheets

(56) References Cited

U.S. PATENT DOCUMENTS

2010/0201409 A1    8/2010  Terada et al.
2011/0025381 A1*  2/2011  Yamahira ........... H03K 5/15013
                                                              327/117
2019/0173476 A1*  6/2019  He ....................... H03K 23/588

OTHER PUBLICATIONS

Partial International Search Report—PCT/US2023/030977—ISA/EPO—dated Dec. 19, 2023.

* cited by examiner

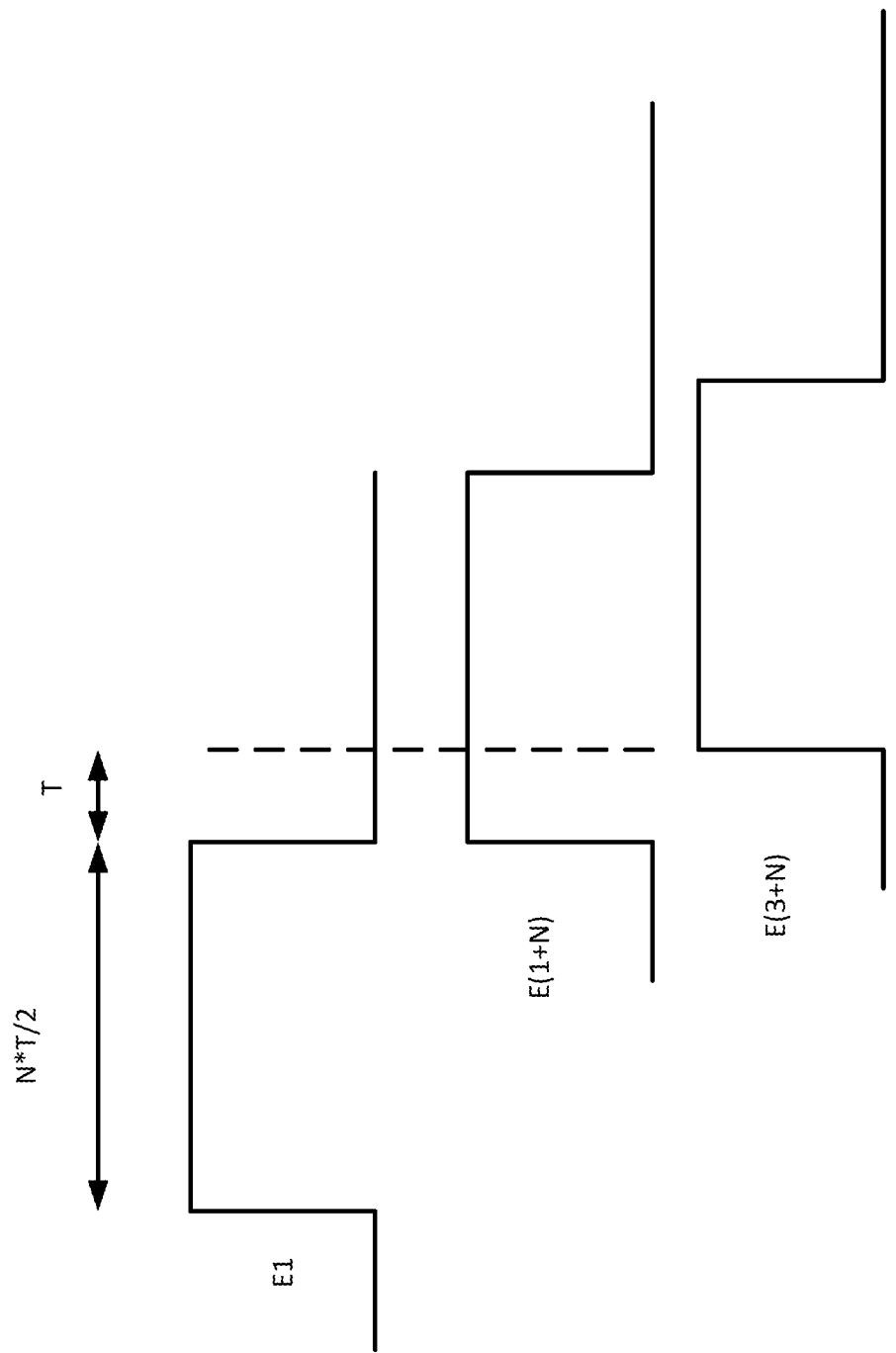

US 11,923,849 B1

FREQUENCY DIVIDER FOR NON-OVERLAPPING CLOCK SIGNALS

TECHNICAL FIELD

This application relates to frequency dividers, and more particularly, to a frequency divider that generates non-overlapping clock signals.

BACKGROUND

In a plurality of non-overlapping clock signals, only one of the clock signals will be in a binary true state at any given time. This binary true state may be a power supply voltage in a binary-high convention or ground in a binary-low convention. Regardless of the binary-high (or low) convention, non-overlapping clock signals have many uses in electronic systems. For example, modern receivers may use passive mixers that are driven by a plurality N of non-overlapping clock signals, N being a plural positive integer. However, the generation of non-overlapping clock signals typically consumes substantial power and may suffer from excessive phase noise.

SUMMARY

A frequency divider is provided for the generation of non-overlapping clock signals that includes: a plurality of stages arranged in series from a first stage to an Nth stage, wherein N is an integer of three or greater and each stage comprises: a 3-input logic gate having an output terminal coupled to a first input terminal of a 2-input logic gate, and wherein an output terminal of the 2-input logic gate in each preceding stage in the series is coupled to a first input terminal of the 3-input logic gate in a subsequent stage in the series, and wherein an output terminal of the 2-input logic gate in the Nth stage is coupled to a first input terminal of the 3-input logic gate in the first stage.

In addition, a frequency divider is provided that includes: a differential clock source configured to output a positive input clock signal and a negative input clock signal that is a complement of the positive input clock signal; a plurality of N latches, wherein N is a plural positive integer greater than two; a plurality of N first logic gates, each first logic gate having a first output terminal coupled to a reset input terminal of a corresponding one of the latches, each first logic gate being configured to process a unique pair of overlapping clock signals from a plurality of 2N overlapping clock signals with one of the positive input clock signal and the negative input clock signal to output, at the first output terminal, a corresponding non-overlapping clock signal from a first plurality of N non-overlapping clock signals; and a plurality of N second logic gates, each second logic gate having a second output terminal coupled to a set input terminal of a corresponding one of the latches, each second logic gate being configured to process a unique pair of overlapping clock signals from the plurality of 2N overlapping clock signals with one of the positive input clock signal and the negative input clock signal to output, at the second output terminal, a corresponding non-overlapping clock signal from a second plurality of N non-overlapping clock signals.

In addition, a frequency divider is provided that includes: a differential clock source configured to cycle a positive input clock signal and a negative input clock signal at a first frequency, wherein the negative input clock signal is a complement of the positive input clock signal; a plurality of N latches, each latch being configured to output a corresponding pair of overlapping clock signals from 2N overlapping clock signals that cycle at a second frequency that is 1/Nth of the first frequency and have approximately a 50% duty cycle, wherein N is an integer of 3 or greater; and a plurality of 2N logic gates configured to output 2N non-overlapping clock signals that cycle at the second frequency and have approximately a (50/N) % duty cycle, each logic gate being configured to process two of the 2N overlapping clock signals with one of the negative input clock signal and the positive input clock signal to output a corresponding one of the 2N non-overlapping clock signals at an output terminal of the logic gate.

Finally, a method of frequency division is provided that includes: dividing an input clock signal in frequency by a divisor N into a plurality of 2N overlapping clock signals; wherein N is an integer of three or greater and each overlapping clock signal has a duty cycle of approximately 50%; and processing pairs of the overlapping clock signals with the input clock signal to divide the input clock signal in frequency by the divisor N into a plurality of 2N non-overlapping clock signals each having a duty cycle of approximately (50/N) %.

These and other advantageous features may be better appreciated through the following detailed description.

BRIEF DESCRIPTION OF THE DRAWINGS

FIG. 3 is a timing diagram illustrating a time difference between three example overlapping clock signals in accordance with an aspect of the disclosure.

Implementations of the present disclosure and their advantages are best understood by referring to the detailed description that follows. It should be appreciated that like reference numerals are used to identify like elements illustrated in one or more of the figure.

DETAILED DESCRIPTION

Figure 1A:
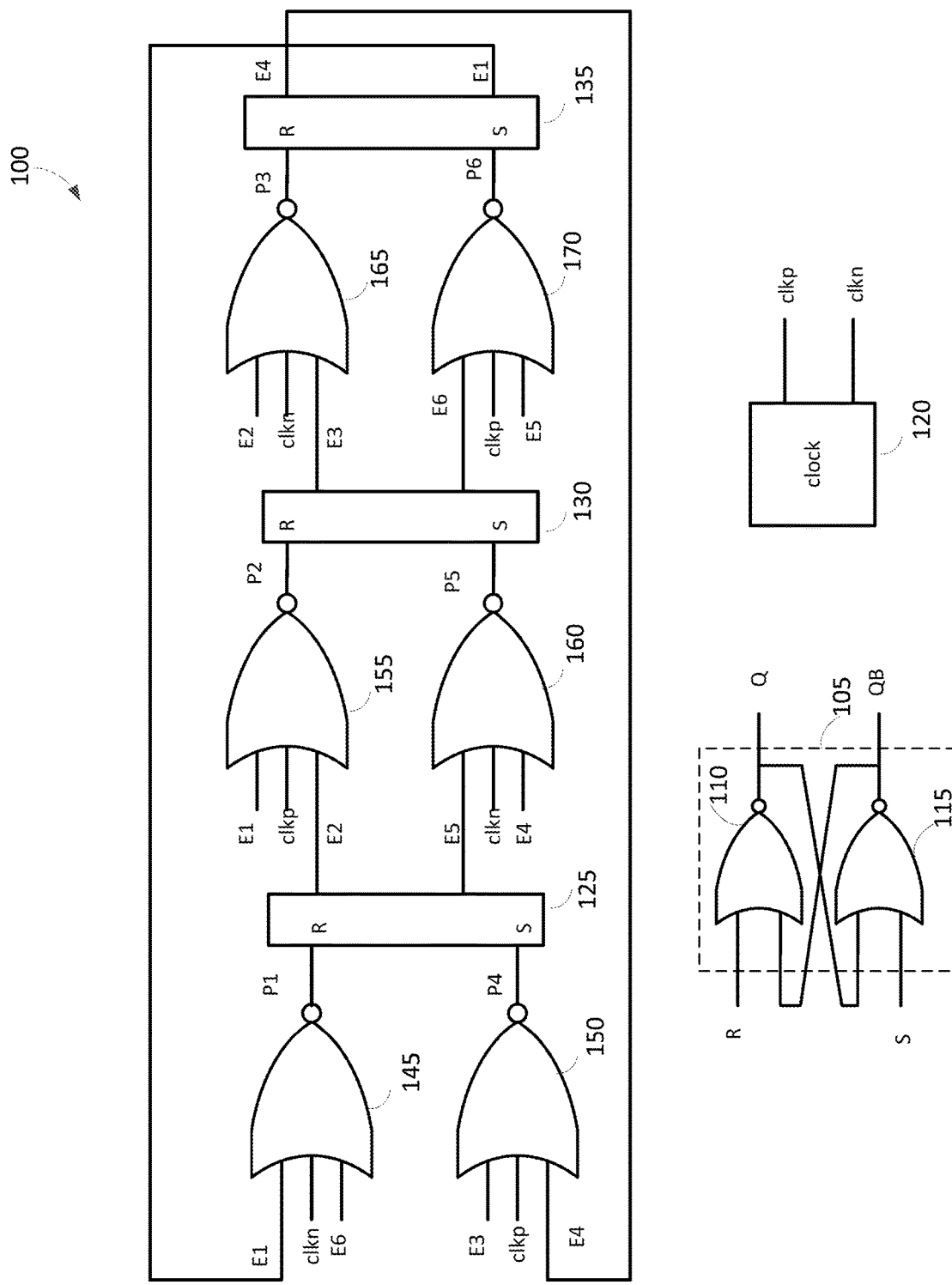
FIG. 1A is a circuit diagram of a divide-by-3 frequency divider in accordance with an aspect of the disclosure.

A frequency divider is provided that divides an input clock signal according to a positive integer N into a plurality of 2N non-overlapping clock signals, where N is three or greater. The input clock signal cycles at a frequency f with a period T. Each non-overlapping clock signal thus has a frequency of f/N and a period of N*T. In the following discussion, each non-overlapping clock signal is deemed to be "asserted" when the non-overlapping clock signal is in a binary true state, regardless of whether the binary true state is represented using a binary-high or a binary-low convention. In implementations in which a binary-high convention is used, each non-overlapping clock signal is thus asserted by being charged to a power supply voltage. Conversely, in implementations in which a binary-low convention is used, each non-overlapping clock signal is asserted by being discharged to ground. Regardless of which convention is used, each non-overlapping clock signal is asserted for just T/2 in each period of N*T. The input clock signal has a 50% duty cycle so that it is also asserted to T/2 in in each period of T.

The frequency divider also divides the input clock signal into a plurality of 2N overlapping clock signals, each having a duty cycle of 50%. Like the non-overlapping clock signals, each overlapping clock signal has a frequency of f/N and a period of N*T. Given the 50% duty cycle, each overlapping clock signal is asserted in one-half of its period, which equals NT/2. Since the assertion time for each non-overlapping clock signal is T/2, this non-overlapping assertion time is 1/Nth the assertion time for each overlapping clock signal. The duty cycle of each non-overlapping clock signal is thus 50%/N.

The 2N overlapping clock signals may be deemed to be arranged from a first overlapping clock signal to a 2Nth overlapping clock signals. With respect to this order or arrangement, an ith overlapping clock signal is timed so as to be delayed by T/2 with respect to an (i−1)th overlapping clock signal, where i is an integer ranging from 2 to 2N. The first overlapping clock signal is delayed by T/2 with respect to the 2Nth overlapping clock signal. To form these 2N overlapping clock signals having this staggered or progressive time-delay relationship, the frequency divider includes a plurality of N set-reset latches. Each latch produces a corresponding pair of the overlapping clock signals. The latches may be deemed to be arranged serially, from a first latch to an Nth latch. With respect to this order, an ith latch produces an (i+1)th overlapping clock signal and an ((i+1)+N)th overlapping clock signal, where i is an integer ranging from 1 to (N−1). The Nth latch produces the first overlapping clock signal and an (N+1)th overlapping clock signal.

Since each latch is a set-reset latch, each latch has a reset input terminal and a set input terminal. When an ith latch is set by an assertion of a voltage of its set input terminal, it asserts the (i+1)th overlapping clock signal. Similarly, when an ith latch is reset by an assertion of a voltage of its reset input terminal, it asserts the (i+(N+1))th overlapping clock signal. Given the time delay of T/2 from one overlapping clock signal to the next, the pair of overlapping clock signals produced by each latch will have a time difference of NT/2. When set, the Nth latch asserts the (N+1)th overlapping clock signal. Similarly, the Nth latch asserts the first overlapping clock signal when reset.

The set input terminal of each latch is controlled by a corresponding three-input logic gate. Since there are N latches, there are N corresponding three-input logic gates to control the setting of the N latches. Similarly, there are N corresponding three-input logic gates to the control the resetting of the N latches. Each latch thus couples to a first three-input logic gate that drives the latch's set terminal and couples to a second three-input logic gate that drives the latch's reset terminal. There is thus a plurality of N three-input first logic gates and a plurality of N three-input second logic gates.

The following discussion will assume that each three-input first and second logic gate is a 3-input NOR gate, but it will be appreciated that a 3-input NAND gate may also be used in alternative implementations. Each 3-input logic gate produces a corresponding one of the 2N non-overlapping clock signals. An example frequency divider 100 in which N equals 3 is shown in FIG. 1A. Since the frequency division is by 3, there are three latches including a first latch 125, a second latch 130, and a third latch 135. With N being 3, there are 2N=6 overlapping clock signals, each designated by E and its index. A first overlapping clock signal is thus designated as E1, a second overlapping clock signal is designated as E2, a third overlapping clock signal is designated as E3, and so on such that a sixth overlapping clock signal is designated as E6.

When set by an assertion of a set (S) terminal, first latch 125 asserts the E2 clock signal and resets (de-asserts) an E5 clock signal. Conversely when reset by an assertion of a reset (R) terminal, first latch 125 asserts the E5 clock signal and resets the E2 clock signal. The E2 and E5 clock signal are thus complements of each other. Since each successive E clock signal is delayed by T/2, the E5 clock signal is delayed by 3T/2 with respect to the E2 clock signal. Similarly, second latch 130 asserts the E3 clock signal and resets the E6 clock signal when set. Second latch 130 also resets the E3 clock signal and asserts the E6 clock signal when reset. The E3 and E6 clock signals are thus complements of each other. In addition, third latch 135 asserts an E4 clock signal and resets the E1 clock signal when set. Finally, third latch 135 asserts the E1 clock signal and resets the E4 clock signal when reset. The E1 and E4 clock signal are thus complements of each other. More generally, each latch produces a complementary pair of overlapping clock signals.

Each latch has its set terminal voltage controlled by a corresponding 3-input NOR gate. Similarly, each latch has its reset terminal voltage controlled by another corresponding 3-input NOR gate. Since there are N latches, there are thus 2N=6 3-input NOR gates for the setting and resetting of the N latches. Each 3-input NOR gate produces or outputs a corresponding non-overlapping clock signal. There are thus 6 non-overlapping clock signals produced by frequency divider 100. The non-overlapping clock signals are designated by a letter P and a corresponding index. In particular, frequency divider 100 produces six P clock signals ranging from a P1 clock signal to a P6 clock signal. Like the overlapping clock signals, each successive non-overlapping clock signal is delayed by T/2 with respect to a preceding non-overlapping clock signal. A P2 clock signal is thus delayed by T/2 with respect to the P1 clock signal. Similarly, a P3 clock signal is delayed by T/2 with respect to the P2 clock signal, a P4 clock signal is delayed by T/2 with respect to the P3 clock signal, and so on such that the P6 clock signal is delayed by T/2 with respect to a P5 clock signal.

Since the setting and resetting of each latch controls the production of each latch's pair of overlapping clock signals, the overlapping clock signals from any given latch are complementary. For example, the E2 and E5 clock signal produced by first latch 125 are complements of each other. Although there is thus no overlap between the E2 and E5 clock signals, note that is still accurate to refer to the E2 and E5 clock signals as overlapping clock signals. For example, the E2 clock signal overlaps with every other E clock signal except the E5 clock signal. Similarly, the E5 clock signal overlaps with every other E clock signal except the E2 clock signal. More generally, each latch produces a complementary pair of E signals that overlap with all the remaining E clock signals. Frequency divider 100 thus functions to divide the clkn and clkp input clock signals in frequency by a divisor N using a plurality of N latches, each latch being configured to output a corresponding pair of overlapping clock signals from 2N overlapping clock signals, where N equals 3.

Given the T/2 delay of each successive E clock signal with respect to its preceding E clock signal, each successive E clock signal will have an overlap of T with the preceding clock signal in which both E clock signals are in a binary false state (which is ground in a binary-high convention) in this divide-by-3 implementation. For example, the E2 clock signal has such an overlap of T with the E1 clock signal. The NOR gates exploit this T overlap by gating each successive E clock signal with the preceding E clock signal with a gating clock signal selected from a positive input clock signal (clkp) and a negative input clock signal (clkn) as produced by a differential clock source 120. For example, a 3-input NOR gate 155 NORs the E1 clock signal with the E2 clock signal and with the clkp input clock signal to produce the P2 clock signal to drive the reset input terminal of the second latch 130. Note how advantageous this gating is: without the gating by the selected input clock signal, the E1 and E2 clock signals will both be in a binary zero state for T in each of their periods since the E2 clock signal is delayed by T/2 with respect to the E1 clock signal. An output signal from NOR gate 155 would then pulse high during this T-long stretch of time in which both the E1 and the E2 clock signals are in the binary zero state. Note that frequency divider 100 could not produce non-overlapping clock signals if each non-overlapping clock signal had an assertion time of T. But when gated by one of the input clock signals, the output signal from NOR gate 155 can form the desired non-overlapping P2 clock signal.

In that regard, it is known to construct a frequency divider from a serially arranged set of flip-flops. Such a serially arranged set of flip-flops may produce the equivalent of the overlapping clock signals with a 50% duty cycle. But a separate combinational logic circuit would then be needed to process the overlapping clock signals from such a frequency divider to obtain the non-overlapping clock signals. In sharp contrast, frequency divider 100 itself not only produces the E clock signals (the overlapping clock signals) but also the P clock signals (the non-overlapping clock signals). The result is a significant reduction in semiconductor die space to implement frequency divider 100. In addition, frequency divider 100 may be readily modified as explained herein to accommodate any desired even or odd value of N. Moreover, frequency divider 100 reduces power consumption as compared to the use of a separate combinational logic circuit. Yet another advantage of frequency divider 100 is reduced phase noise in the E and P clock signals.

The remaining set and reset input terminals for the latches in frequency divider 100 are coupled to corresponding 3-input NOR gates that NORs the appropriate E clock signals (a pair of E signals having a time delay between them of T/2) with the appropriate gating clock. Which one of the clkp or clkn input clock signals that is used to gate the NOR gate output depends upon which P clock signal is being generated. For example, a 3-input NOR gate 145 produces the P1 clock signal to drive the reset input terminal of first latch 125 through a NOR of the E1 clock signal, the E6 clock signal, and the clkn input clock signal. Note that the clkp input clock signal could also have been selected. But whatever input clock signal is selected, that determines the input clock signal selection for the NOR gate producing the subsequent P clock signal. Thus, NOR gate 155 is gated by the clkp input clock signal since NOR gate 145 is gated by the clkn input clock signal. Similarly, a 3-input NOR gate 165 NORs generates the P3 clock signal to drive the reset terminal of third latch 135 through a NOR of the E2 and E3 clock signals and the clkn input clock signal. In sum, the clkn and clkp input clock signals are alternately provided to the inputs of the series of NOR gates 145-170.

The setting of the latches is controlled by an analogous 3-input NOR gate. For example, a 3-input NOR gate 150 NORs the E3 clock signal with an E4 clock signal and also with the clkp input clock signal to produce the P4 clock signal to control the setting of first latch 125. Note that NOR gate 150 is gated by the complement of the input clock signal that gates NOR gate 145. This is because of the T/2 delay between each successive non-overlapping clock signal and its preceding non-overlapping clock signal. In this case, the P4 clock signal is thus delayed by 3T/2 with respect to the P1 clock signal. If NOR gate 150 were instead gated by the clkn input clock signal, the P4 clock signal would then overlap with P3. But by gating NOR gate 150 with the clkp input clock signal, the desired non-overlapping time shift is achieved. Similarly, a NOR gate 160 NORs the E5 and E4 clock signals with the clkn input clock signal to produce the P5 clock signal to control the setting of second latch 130. Finally, a NOR gate 170 NORs the E6 and E5 clock signals with the clkp input clock signal to produce the P6 clock signal to control the setting of third latch 135.

Each latch may be implemented using a cross-coupled pair of logic gates (e.g., NAND gates, NOR gates, etc.) In one implementation, each latch is formed using a cross-coupled pair of NOR gates 110 and 115 as shown for an example cross-coupled-NOR gate latch 105. A corresponding E clock signal produced at a Q output terminal will then be asserted when the set input terminal (S) of latch 110 is asserted. Similarly, a corresponding E clock signal produced at a QB output terminal will then be asserted when the reset input terminal (R) of latch 110 is asserted. Note that the latches in frequency divider 100 may instead be produced using a pair of cross-coupled NAND gates in alternative implementations.

Figure 1B:
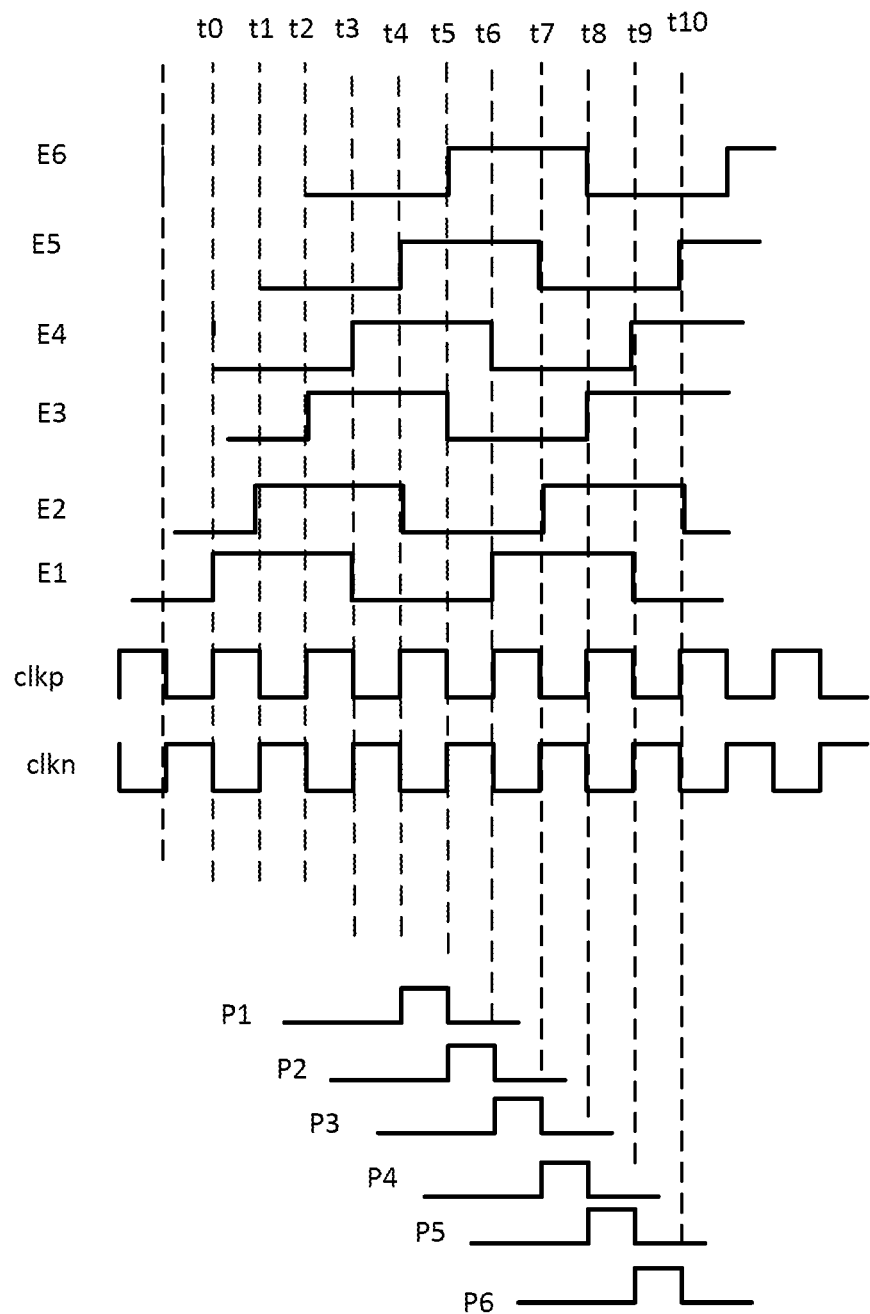
FIG. 1B is a timing diagram for the clock signals of FIG. 1A.

The resulting timing of the E and P clock signals in frequency divider 100 as controlled by the clkp and clkn input clock signals is shown in FIG. 1B. The E1 clock signal begins a cycle at a time t0 by rising from ground to a power supply voltage as triggered by corresponding edge in one of the input clock signals. In this implementation, the rising edge of the clkp input clock signal triggers the rising edge of the E1 clock signal. In alternative implementations, the rising edge of the clkn input clock signal may be used to trigger the rising edge of the E1 clock signal. With the rising edge of the E1 clock signal occurring at time to, the E2 clock signal thus has a rising edge at a time t1 that is T/2 after time t0 since each successive E clock signal is delayed by T/2 with respect to the preceding E clock signal. Similarly, the E3 clock signal has a rising edge at a time t2 that is T/2 after time t1. The E4 clock signal has a rising edge at a time t3 that is T/2 after time t2 whereas the E5 clock signal has a rising edge at a time t4 that is T/2 after time t3. Similarly, the E6 clock signal has a rising edge at a time t5 that is T/2 after time t4. The E clock period is N*T, which is 3T in this divide-by-3 implementation. The E1 clock signal thus begins another cycle at a time t6 that is T/2 after time t5 and 3T after time t0. Each E clock signal in a divide-by-three implementation thus has a period that 3 times the period T of the input clock signals.

The resetting of the latches and the corresponding assertions of clock signals P1, P2, and P3 will be discussed first.

Clock signals E1 and E6 are both in a binary zero state from time t3 to time t5. The clkn input clock signal is a binary zero from time t4 to time t5 so that is when NOR gate 145 asserts the P1 clock signal. The P1 clock signal assertion resets first latch 125 so that the E5 clock signal has a rising edge at time t3. Similarly, the E2 and E1 clock signals are both in a binary zero state from time t4 to time t6. The clkp input clock signal is a binary zero from time t5 to time t6 so that is when NOR gate 155 asserts the P2 clock signal. The P2 clock signal assertion resets second latch 130 so that the E6 clock signal has a rising edge at time t5. The E2 and E3 clock signals are both in a binary zero state from time t5 to a time t7 that is T/2 after time t6. The clkn input clock signal is a binary zero from time t6 to time t7 so that is when NOR gate 165 asserts the P3 clock signal. The P3 clock signal assertion resets third latch 135 so that the clock signal E1 has a rising edge at time t7.

The setting of the latches and the corresponding assertions of clock signals P4, P5, and P6 will now be discussed. Clock signals E3 and E4 are both in a binary zero state from time t6 to a time t8 that is T/2 after time t7. The input clock signal clkp is a binary zero from time t7 to time t8 so that is when NOR gate 150 asserts the P4 clock signal. The P4 clock signal assertion sets first latch 125 so that the E3 clock signal has a rising edge at time t7. Clock signals E5 and E4 are both in a binary zero state from time t7 to a time t9 that is T/2 after time t8. The input clock signal clkn is a binary zero from time t8 to time t9 so that is when NOR gate 160 asserts the P5 clock signal. The P5 clock signal assertion sets second latch 130 so that the E3 clock signal has a rising edge at time t8. Finally, clock signals E6 and E5 are both in a binary zero state from time t8 to a time t10 that is T/2 after time t9. The input clock signal clkp is a binary zero from time t9 to time t10 so that is when NOR gate 170 asserts the P6 clock signal. The P6 clock signal assertion sets third latch 135 so that the clock signal E4 has a rising edge at time t9. Clock signal P1 will then begin a new cycle (not illustrated) at time t10.

Figure 1C:
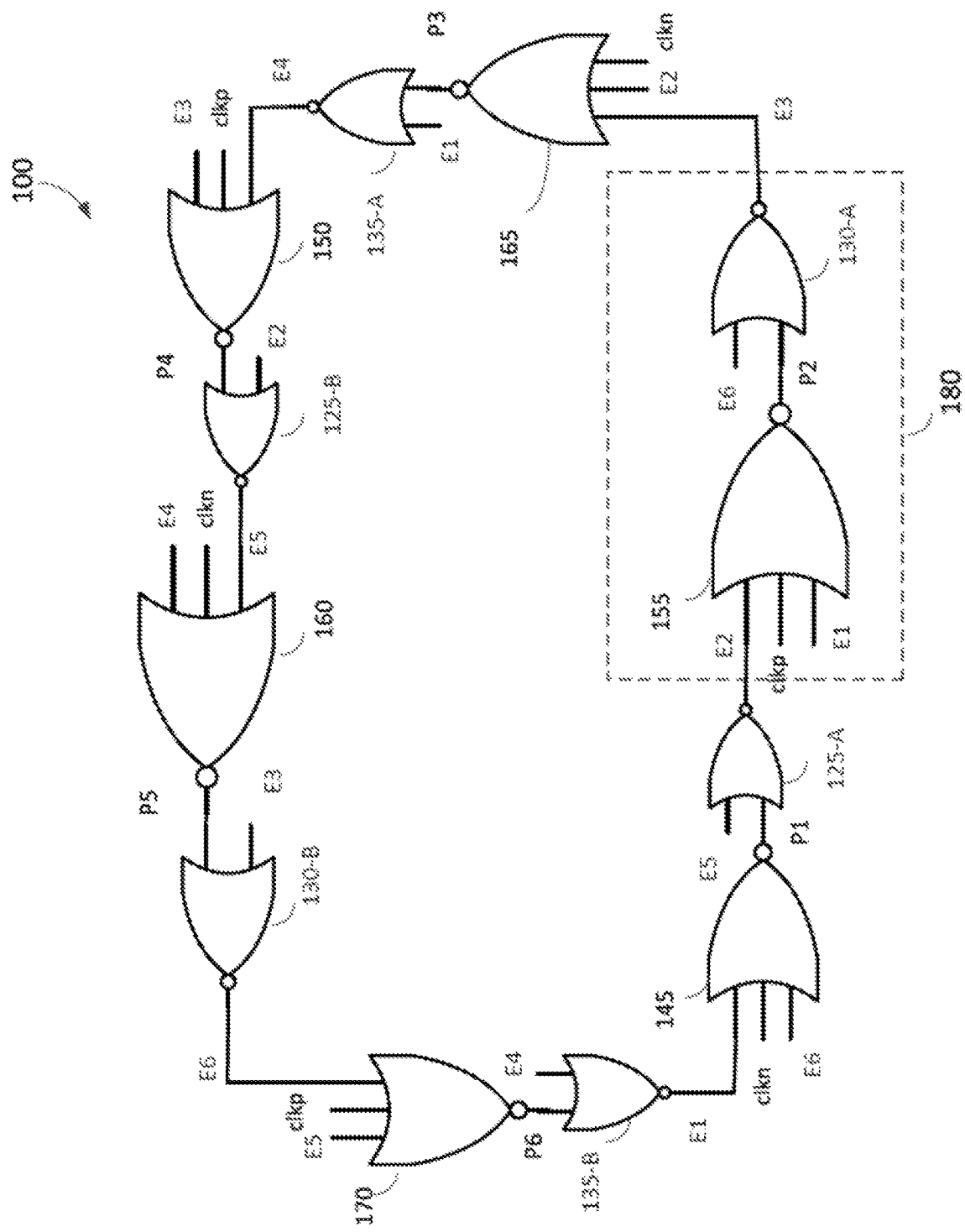
FIG. 1C is an alternative circuit diagram of the divide-by-3 frequency divider of FIG. 1A.

With each latch being implemented using a pair of cross-coupled 2-input NOR gates as discussed with regard to latch 105, it may be seen that the resulting 3-input NOR gates and 2-input NOR gates form a plurality of 2N (in this case, six) stages arranged in a serial ring, each stage including a corresponding 3-input NOR gate and a corresponding 2-input NOR gate. For example, frequency divider 100 may be illustrated as shown in FIG. 1C including an example stage 180. Referring back to FIG. 1A, note that NOR gate 155 is driving the reset input terminal of second latch 130 with the P2 clock signal. With the latches being implemented by cross-coupled 2-input NOR gates as shown for latch 105, the corresponding NOR gate in second latch 130 having an input terminal coupled to the output terminal of NOR gate 155 is designated as NOR gate 130-A. NOR gate 130-A is cross-coupled with a NOR gate 130-B that outputs the E6 clock signal. NOR gates 130-A and 130-B form the second latch 130 of FIG. 1A. The output terminal of NOR gate 130-A couples to an input terminal of NOR gate 165 to drive NOR gate 165 with the E3 clock signal.

NOR gate 165 forms another stage with a NOR gate 135-A from third latch 135. As already discussed, NOR gate 165 NORs the E3 and E2 clock signals with the clkn input clock signal to output the P3 clock signal. NOR gate 135-A is cross coupled with a NOR gate 135-B to form the third latch 135 of FIG. 1A. Similarly, a NOR gate 125-A is cross coupled with a NOR gate 125-B to form the first latch 125 of FIG. 1A. A comparison of FIGS. 1A and 1C demonstrates the equivalence of the two representations of frequency divider 100. Thus, the remaining elements of FIG. 1C will not be discussed further.

Figure 2A:
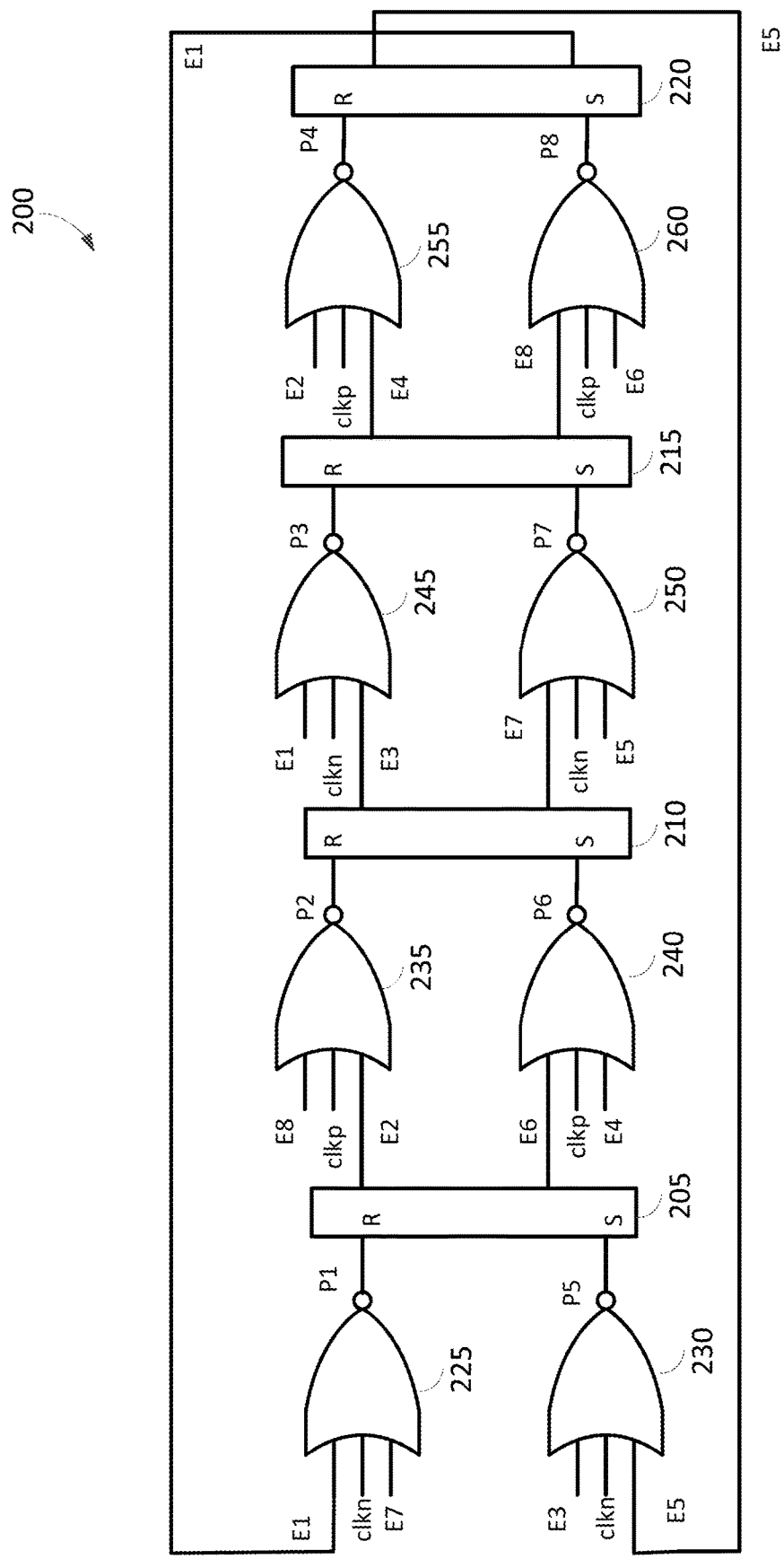
FIG. 2A is a circuit diagram of a divide-by-4 frequency divider in accordance with an aspect of the disclosure.

It will be appreciated that frequency divider 100 is just one implementation for a specific value of N (in this case, 3). But the principles from frequency divider 100 may be generalized to produce a frequency divider for an arbitrary integer divisor N that is greater than 3. For example, a frequency divider 200 shown in FIG. 2A divides the input clock signals clkp and clkn by four (N=4) to produce a plurality of 8 overlapping clock signals (E1 through E8) and a plurality of 8 non-overlapping clock signals (P1 through P8). Since N is four, frequency divider 200 has a serial arrangement of four latches formed by a first latch 205, a second latch 210, a third latch 215, and a fourth latch 220. Each latch controls a corresponding pair of the E clock signals. But note that the period of the E clock signals for frequency divider 400 is now 4T such that each E clock signal is in a binary zero state (or binary high state) for 2T each clock cycle. Since the gating at the 3-input NOR gates exploits pairs of E signals that have a T overlap, each 3-input NOR gate in frequency divider 200 does not process successive pairs of E signals as was done in frequency divider 100. In particular, each 3-input NOR gate in frequency divider 100 processes a pair of E clock signals in which one of the E clock signals is delayed by T/2 with respect to the other. But in frequency divider 200, each 3-input NOR gate processes a pair of E clock signals in which one of the E clock signals is delayed by T with respect to the other. In this fashion, the T overlap for the mutual binary-zero state is achieved.

Figure 2B:
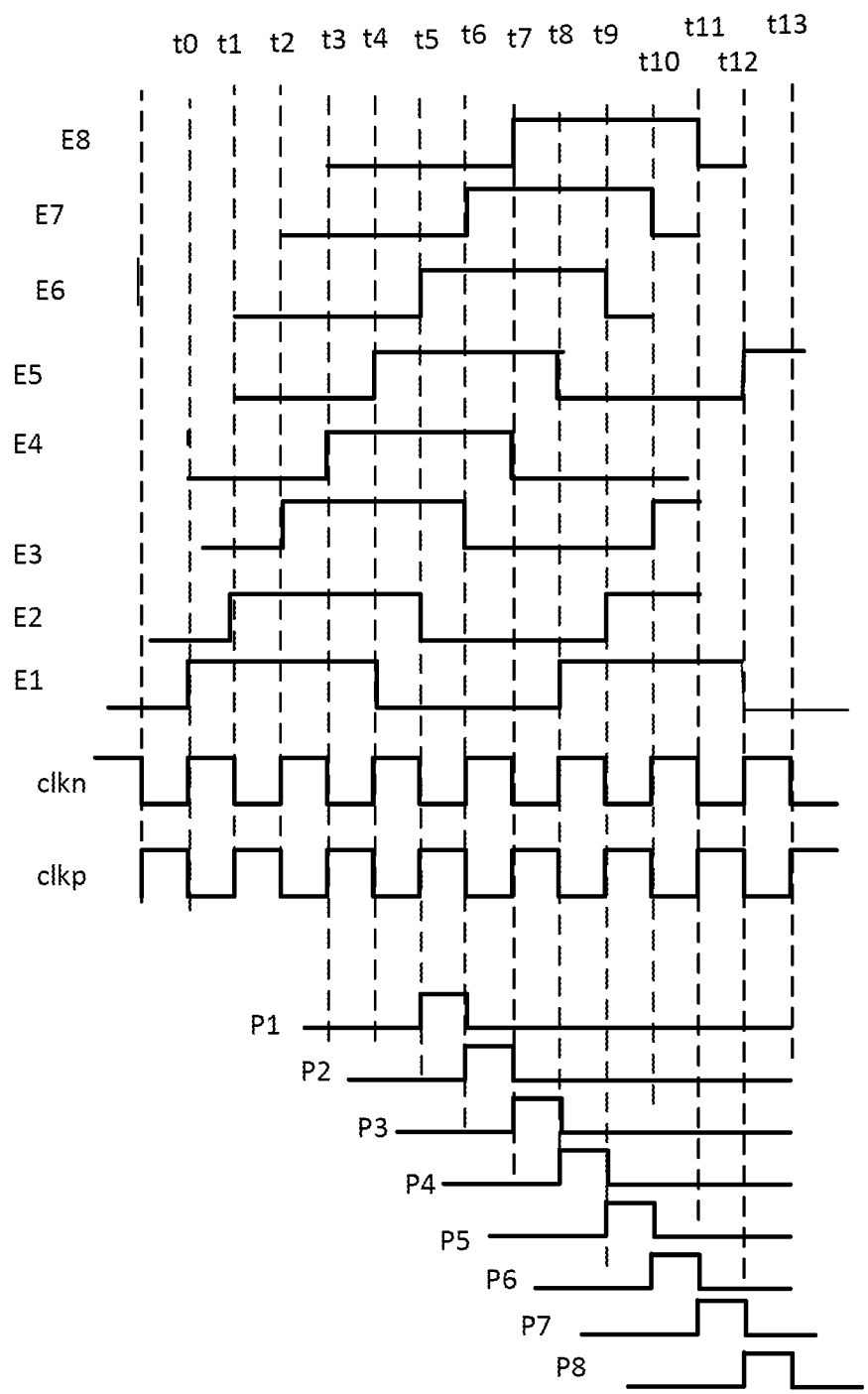
FIG. 2B is a timing diagram for the clock signals of FIG. 2A.

The structure of frequency divider 200 will now be further explained in conjunction with the timing diagram for frequency divider 200 that is shown in FIG. 2B. The E1 clock signal has a rising edge at a time t0. The E2 clock signal has a rising edge at a time t1 that is T/2 after time t0, the E3 clock signal has a rising edge at a time t2 that is T/2 after time t1, and so on. For example, the E4 clock signal rising edge is at a time t3, the E5 clock signal rising edge is at a time t4, the E6 clock signal rising edge is at a time t5, the E7 clock signal rising edge is at a time t6, and the E8 clock signal rising edge is at a time t7. Each E clock signal may be paired with another E clock signal to form a pair of E clock signals that have an overlap of T in which both E clock signals are in the binary-zero state. For example, the E1 and E7 clock signals have this overlap of T such that both signals are a binary zero from time t4 to time t6.

The resetting of the latches will be discussed first followed by a discussion of the setting of the latches. A NOR gate 225 that NORs the E1 and E7 clock signals with the clkn input clock signal will then assert the P1 clock signal at time t5. The assertion of the P1 clock signal resets first latch 205 so that clock signal E6 has the rising edge at time t5. The E2 and E8 clock signals have an overlap of T such that both signals are a binary zero from time t5 to time t7. A NOR gate 235 that NORs the E2 and E8 clock signals with the clkp input clock signal will then assert the P2 clock signal at time t6. The assertion of the P2 clock signal resets second latch 210 so that clock signal E7 has a rising edge at time t6. The E1 and E3 clock signals have an overlap of T such that both signals are a binary zero from time t6 to a time t8 that is T/2 after time t7. A NOR gate 245 that NORs the E1 and E3 clock signals with the clkn input clock signal will then assert the P3 clock signal at time t7. The assertion of the P3 clock signal resets third latch 215 so that clock signal E8 has a rising edge at time t7. Finally, the E2 and E4 clock signals have an overlap of T such that both signals are a binary zero from time t7 to a time t9 that is T/2 after time t8. A NOR gate 255 that NORs the E2 and E4 clock signals with the clkp input clock signal will then assert the P4 clock signal at time t8. The assertion of the P3 clock signal resets fourth latch 220 so that clock signal E1 has a rising edge at time t8.

With regard to the setting of the latches, the E3 and E5 clock signals have an overlap of T such that both signals are a binary zero from time t8 to a time t10 that is T/2 after time t9. A NOR gate 230 that NORs the E3 and E5 clock signals with the clkn input clock signal will then assert the P5 clock signal from time t9 to time t10. The assertion of the P5 clock signal sets first latch 205 so that clock signal E2 has a rising edge at time t9. Similarly, a NOR gate 240 that NORs the E6 and E4 clock signals with the clkp input clock signal will then assert the P6 clock signal from time t10 to a time t11 that is T/2 after time t10. The assertion of the P6 clock signal sets second latch 210 so that the E3 clock signal has a rising edge at time t10. In addition, a NOR gate 250 that NORs the E7 and E5 clock signals with the clkn input clock signal will then assert the P7 clock signal from time t11 to a time t12 that is T/2 after time tn. The assertion of the P7 clock signal sets third latch 215 so that the E4 clock signal has a rising edge at time t11. Finally, a NOR gate 260 that NORs the E6 and E8 clock signals with the clkp input clock signal will then assert the P8 clock signal from time t12 to a time t13 that is T/2 after time t12. The assertion of the P8 clock signal sets fourth latch 220 so that the E5 clock signal has a rising edge at time t12.

A comparison of frequency dividers 100 and 200 demonstrates a general pattern for values of odd N and values of even N. For example, the latches may be deemed to be arranged from a first latch to an Nth latch. A first N of the plurality of 2N P clock signals may also be deemed to have the same arrangement, from the P1 clock signal to a PN clock signal. Regardless of whether the divisor N is odd or even, each latch is reset by the corresponding P clock signal. For example, the P1 clock signal resets the first latch, the P2 clock signal resets the second latch, and so on such that the PN clock signal resets the Nth latch. Similarly, a second N of the P clock signals that ranges from a P(N+1) clock signal to a P2N clock signal controls the setting of the latches. The P(N+1) clock signal thus sets the first latch, a P(N+2) clock signal sets the second latch, and so on such that the P2N clock signal sets the Nth latch.

The plurality of 2N E clock signals may also be deemed to form a first half that ranges from the E1 clock signal to an EN clock signal and to form a second half that ranges from an E(N+1) clock signal to an E2N clock signal. The first half are processed by the 3-input NOR gates that control the resetting of the latches. For example, a 3-input NOR gate that controls the resetting of a first latch processes the E1 clock signal. Similarly, a 3-input NOR gate that controls the resetting of a second latch processes the E2 clock signal, and so on such that a 3-input NOR gate that controls the resetting of an Nth latch processes the EN clock signal. Each of these resetting NOR gates also processes a E clock signal that has a T overlap with the other E clock signal being processed. The selection of this E clock signal depends upon the divisor N. For example, consider the E1 clock signal shown in FIG. 3. Regardless of the value of the divisor N, the corresponding frequency divider that divides by the divisor N will generate an E1 clock signal. As already discussed, each successive E clock signal is delayed by T/2 with respect to its preceding E clock signal. There is thus an E2 clock signal (not shown) that is delayed by T/2 with respect to the E1 clock signal, and so on. An E(N+1) clock signal will thus have a rising edge at the falling edge of the E1 clock signal. This is true because the half period of each E clock signal is NT/2. Each half period may thus be divided into N parts of T/2 each. The E(N+1) clock signal will thus have its rising edge at a delay of NT/2 from the rising edge of the E1 clock signal. To get the T overlap with E1, the E clock signal that is T delayed from the E(N+1) clock signal is selected. Since T is two half input clock cycles, such an E clock signal is the second E clock signal subsequent to the E(N+1) clock signal. Thus, the E(N+3) clock signal will provide the desired T overlap with the E1 clock signal, regardless of whether N is odd or even. A 3-input NOR gate that controls the resetting of the first latch and that processes the E1 clock signal will then also process the E(N+3) clock signal. Analogous reasoning shows that the resetting 3-input NOR for each successive latch is indexed by 1 from this resetting of the first latch. For example, the 3-input NOR gate that controls the resetting of the second latch will process E2 and the E(N+4) clock signal, and so on. Should this indexing lead to a value that is greater than 2N, a modulo-2N value is taken. For example, the indexing without any modulus being taken leads to the 3-input NOR gate that controls the resetting of the Nth latch to process the EN clock signal and an E(2N+2) clock signal. Since (2N+2) is greater than 2N, the modulo-2N value is taken, which is 2. Thus, the resetting of the Nth latch is controlled by a NOR of the EN clock signal, the E2 clock signal, and one of the input clock signals.

As indicated earlier, it is arbitrary which input clock signal is processed by the 3-input NOR gate that resets the first latch. But once a selection is made, each subsequent latch's resetting is controlled by the complement of the input clock signal that controlled the resetting of the previous latch. Similarly, the setting of the first latch is controlled by a complement of the input clock signal that controlled the setting of the Nth latch. This leads to two general patterns that depends upon whether the divisor N is even or odd. Should the divisor N be even, the resetting of the Nth latch is controlled by the complement of the input clock that controlled the resetting of the first latch. Conversely, if the divisor N is odd, the resetting of the Nth latch is controlled by the same input clock signal that controlled the resetting of the first latch. This can be seen for frequency divider 100 for which the divisor N is odd: both NOR gates 145 and 165 process the clkn input clock signal. But in frequency divider 200, NOR gate 225 processes the clkn input clock signal whereas NOR gate 255 processes the clkp input clock signal.

Figure 4:
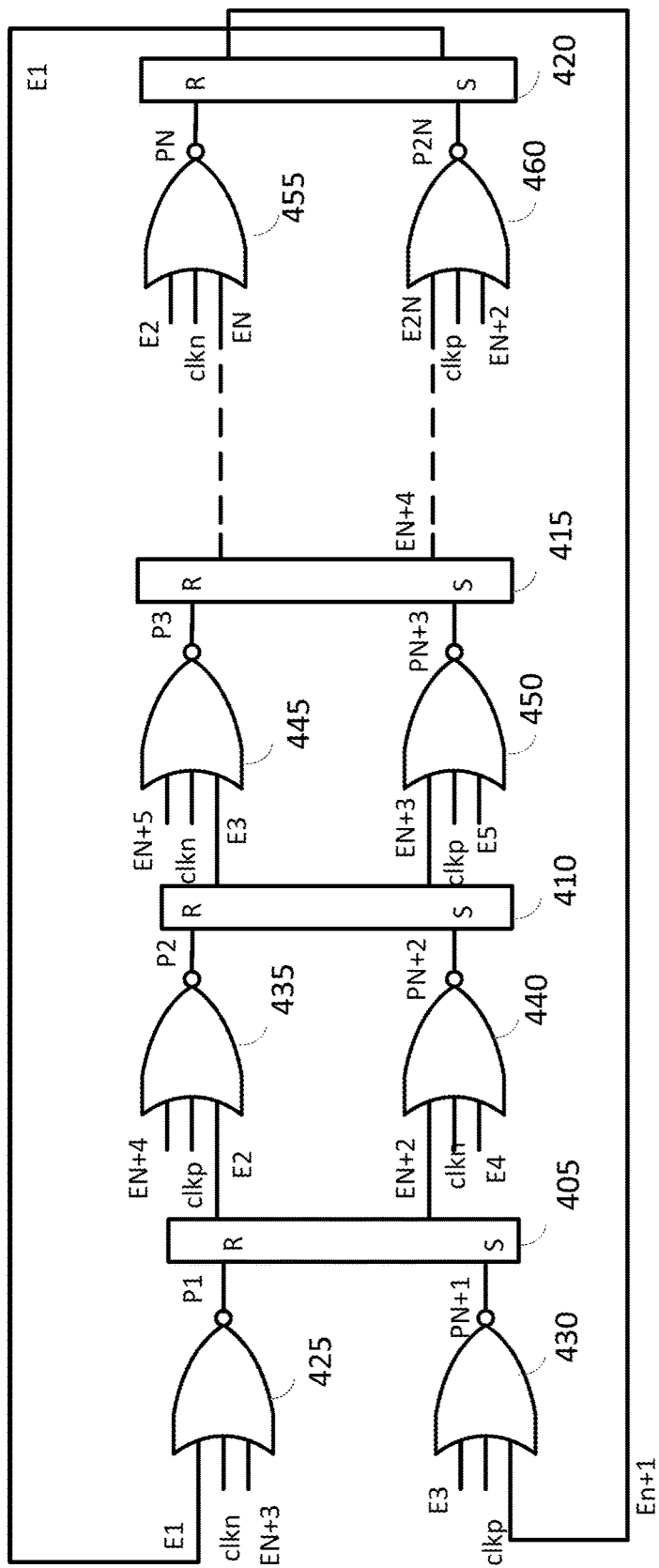
FIG. 4 is a circuit diagram for a divide-by-N frequency divider in which N is odd in accordance with an aspect of the disclosure.

The resetting of the latches for an odd divisor N may thus be generalized as shown in FIG. 4 for a frequency divisor 400. There are N latches ranging from a first latch 405 to an Nth latch 420. A NOR gate 425 NORs the E1 clock signal and the E(N+3) clock signal with one of the input clock signals to generate the P1 clock signal to reset the first latch 405. In this implementation, the clkn input clock signal is selected although the clkp input clock signal may be selected for alternative implementations. The selection of the input clock signal for the gating of NOR gate 425 then determines the input clock selection for all the remaining latch resetting and latch setting NOR gates. In response to being reset, first latch 405 asserts the E(N+2) clock signal and resets the E2 clock signal. To control the resetting of the second latch 410, a NOR gate 435 NORs the E(N+4) and E2 clock signals with the clkp input clock signal to produce the P2 clock signal. The clkp input clock signal is selected because the P2 clock signal is delayed by T/2 with respect to the P1 clock signal. In response to being reset, the second latch 410 asserts the E(N+3) clock signal and resets the E3 clock signal. To control the resetting of the third latch 415, a NOR gate 445 NORs the E(N+5) and E3 clock signals with the clkn input clock signal to produce the P3 clock signal. In response to being reset, the third latch 415 asserts the E(N+4) clock signal and resets the E4 clock signal. More generally, it can be appreciated that an ith latch (i being between 1 and less than or equal to 2N) is reset by a NOR gate that NORs the E(i) clock signal with the E(i+N+2) clock signal along with the appropriate input clock signal to produce the Pi clock signal. In response to the assertion of the Pi clock signal, the ith latch asserts the E(i+N+1) clock signal and resets the E(i+1) clock signal. A modulo-2N value is taken of (i+N+1) if it exceeds 2N. This general pattern is true for the Nth latch 420 because it is reset by a NOR gate that NORs the EN clock signal. The E(i+N+2) clock signal is E2 when i is N. Thus, the Nth latch 420 is reset by a NOR gate 455 that NORs E2 with EN. In response to being reset, the Nth latch 420 asserts the E1 clock signal and resets the E(N+1) clock signal. The gating clock for NOR gate 455 is of the same polarity as selected for the gating of NOR gate 425 because there is an odd number of latches. Since the clkn input clock signal was processed by NOR gate 425, this same input clock signal is also processed by NOR gate 455.

A similar pattern exists for the setting of each latch in frequency divider 400. Each latch is set by a 3-input NOR gate that NORs the E signal with the same index plus N as the latch. For example, first latch 405 is reset by a NOR gate 430 that NORs the E(N+1) clock signal. As discussed earlier, the corresponding E signal that has an overlap of T with an ith E clock signal is E(i+N+2). Adding N+2 to the index of the E(N+1) clock signal leads to the E3 clock signal since 2N+3 is greater than 2N. Thus, NOR gate 430 NORs the E(N+1) and E3 clock signals to produce the P(N+1) clock signal. Since the PN clock is gated by the clkn input clock signal, NOR gate 430 is gated by the clkp input clock signal. In response to being set, first latch 405 asserts the E2 clock signal and resets the E(N+2) clock signal. The setting of each successive latch is controlled by a NOR of a pair of E clock signals whose indices are incremented by one with respect to the pair of E clock signal for the preceding latch. Thus, a NOR gate 440 that produces the P(N+2) clock signal to set the second latch 410 functions to NOR the E4 clock signal with the E(N+2) clock signal and the clkp input clock signal. In response to being set, second latch 410 asserts the E3 clock signal and resets the E(N+3) clock signal. Similarly, a NOR gate 450 that produces the P(N+3) clock signal to set the third latch 415 functions to NOR the E5 clock signal with the E(N+3) clock signal and the clkn input clock signal. In response to being set, the third latch 410 asserts the E4 clock signal and resets the E(N+4) clock signal. Finally, a NOR gate 460 asserts the P2N clock signal to control the setting of the Nth latch 420. To produce the P2N clock signal, NOR gate 460 NORs the E2N and E(N+2) clock signals with the clkn input clock signal.

Figure 5:
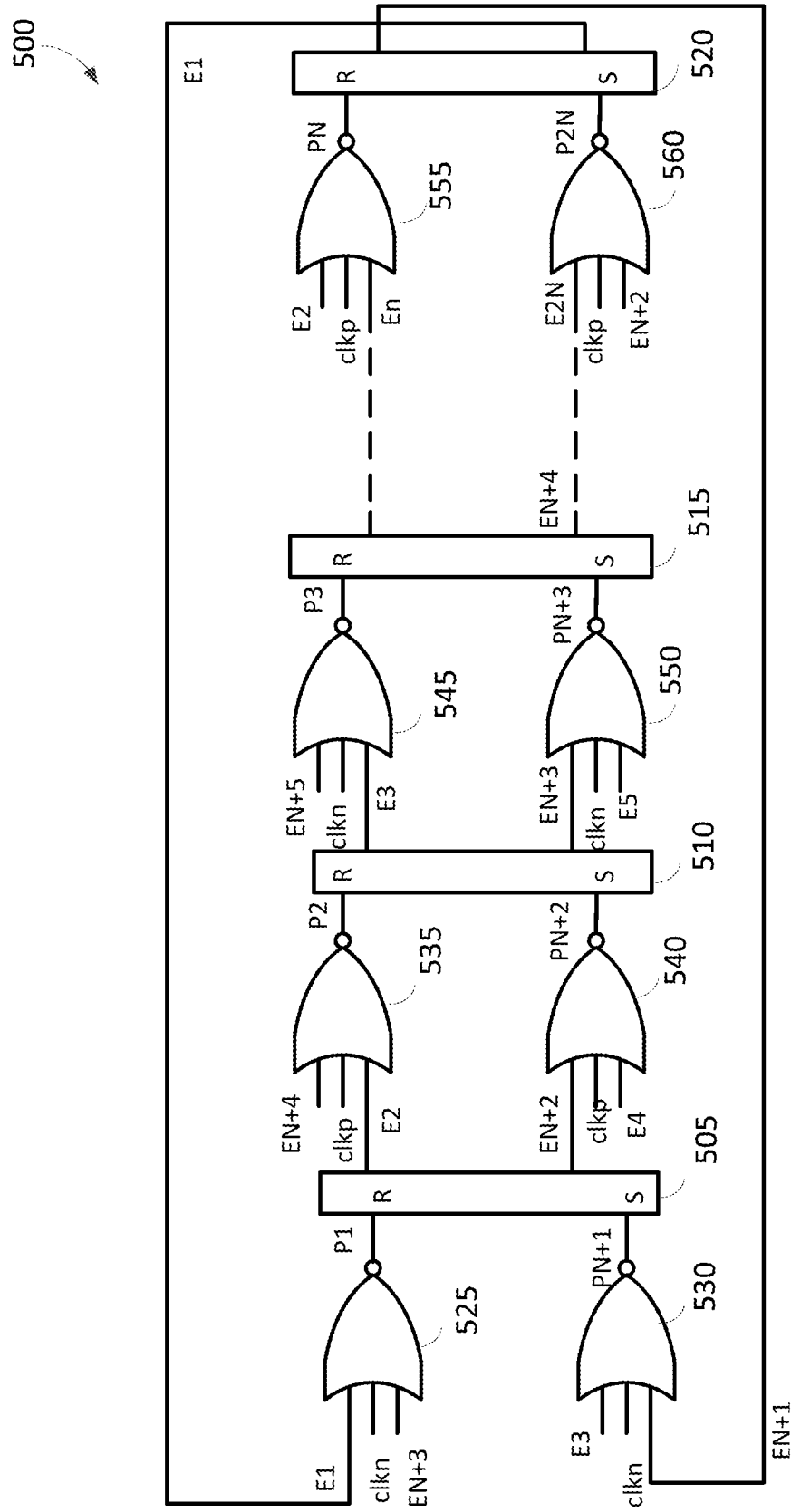
FIG. 5 is a circuit diagram for a divide-by-N frequency divider in which N is even in accordance with an aspect of the disclosure.

With respect to the use of an even divisor N, an example frequency divider 500 is shown in FIG. 5. It may be seen that the same selection of E clock signals occurs for the 3-input NOR gates in frequency divider 500 as was discussed for frequency divider 400. Like frequency divider 400, frequency divider 500 has N latches arranged from a first latch 505 to an Nth latch 520. A NOR gate 525 that resets the first latch with the P1 clock signal NORs the E1 and E(N+3) clock signals with the clkn input clock signal as discussed with regard to NOR gate 425. Similarly, a NOR gate 535 NORs the E2 and E(N+4) clock signals to reset a second latch 510 with the P2 clock signal. NOR gate 535 is thus the equivalent of NOR gate 435. In the same fashion, a NOR gate 545 NORs the E(N+5) and E3 clock signals to reset a third latch 515 with the P3 clock signal. But since there an even number of latches, the Nth latch 520 is reset by NOR gate 555 that is gated by the clkp input clock signal. In contrast, NOR gate 455 is gated by the clkn input clock signal.

The setting of the latches in frequency divider 500 is also analogous to the setting of the latches in frequency divider 400. For example, a NOR gate 530 NORs the E3 and E(N+1) clock signal to control the setting of the first latch 505 with the P(N+1) clock signal. But the gating of NOR gate 530 is controlled by the clkn input clock signal since the clkp input clock signal gates the setting of the Nth latch 520. The setting of the second latch 510 by a NOR gate 540 is thus gated by the clkp input clock signal. Similarly, the setting of the third latch 515 by a NOR gate 550 is gated by the clkn input clock signal. Finally, the setting of the Nth latch 520 by a NOR gate 560 is gated by the clkp input clock signal. Other than the input clock selection, it may be seen that the setting and resetting NOR gates of frequency divider 500 are NORing the same E clock signals as discussed analogously for frequency divider 400.

Figure 6:
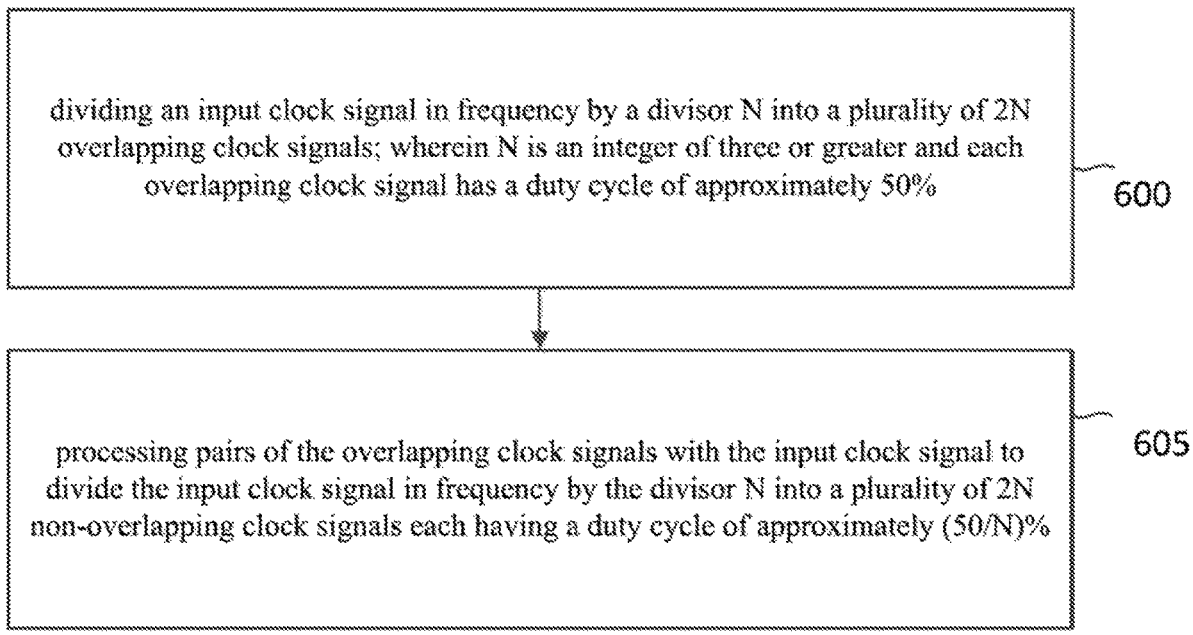
FIG. 6 is a flowchart for an example method of operation for a divide-by-N frequency divider in accordance with an aspect of the disclosure.

A method of frequency division in accordance with the disclosure will now be discussed with respect to the flowchart of FIG. 6. The method includes an act 600 of dividing an input clock signal in frequency by a divisor N into a plurality of 2N overlapping clock signals; wherein N is an integer of three or greater and each overlapping clock signal has a duty cycle of approximately 50%. The division of the input clock signals to form the plurality of E clock signals as discussed with respect to FIGS. 1A, 2A, 4, and 5 is an example of act 600. The method also includes an act 605 of processing pairs of the overlapping clock signals with the input clock signal to divide the input clock signal in frequency by the divisor N into a plurality of 2N non-overlapping clock signals each having a duty cycle of approximately (50/N) %. The processing by the 3-input logic gates of FIGS. 1A, 2A, 4, and 5 to form the P clock signals is an example of act 605.

Figure 7:
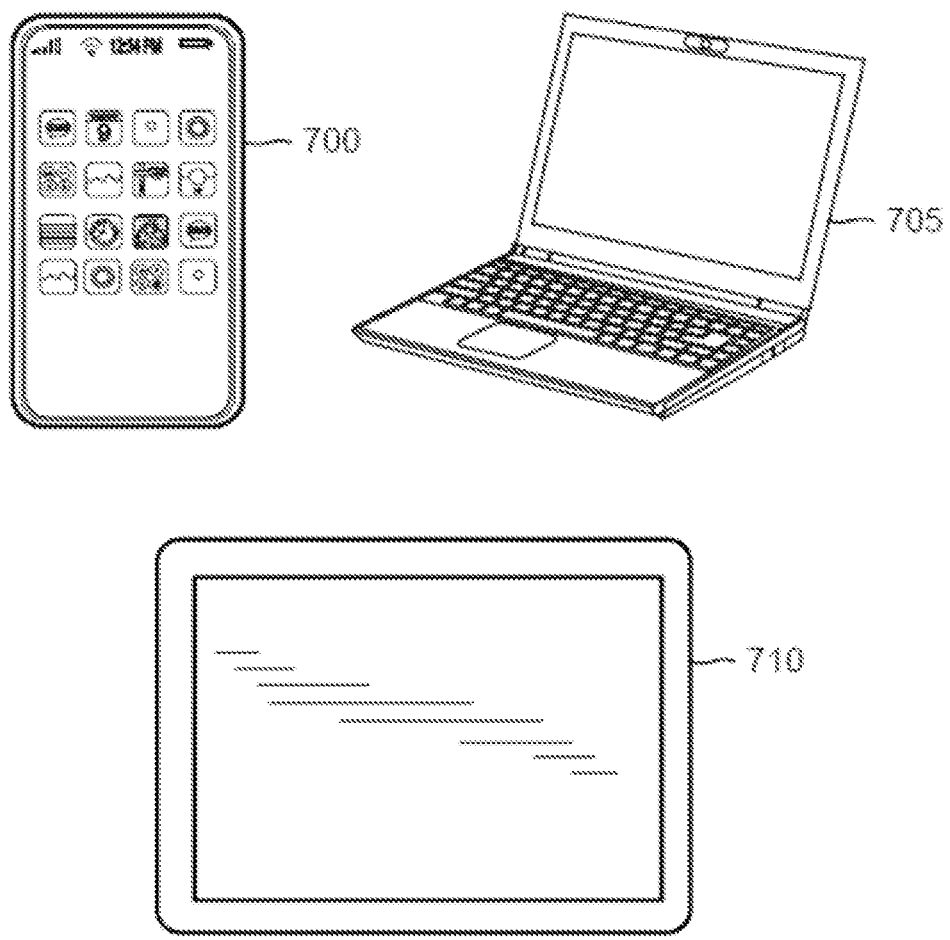
FIG. 7 illustrates some example electronic devices including a frequency divider in accordance with an aspect of the disclosure.

A frequency divider as disclosed herein may be incorporated in any suitable mobile device or electronic system. For example, as shown in FIG. 7, a cellular telephone 700, a laptop computer 705, and a tablet PC 710 may all include a frequency divider in accordance with the disclosure. Other exemplary electronic systems such as a music player, a video player, a communication device, and a personal computer may also be configured with a frequency divider constructed in accordance with the disclosure.

The disclosure will now be summarized in the following series of clauses:

Clause 1. A frequency divider, comprising:
  a plurality of stages arranged in series from a first stage to an Nth stage, wherein N is an integer of three or greater and each stage comprises:
  a 3-input logic gate having an output terminal coupled to a first input terminal of a 2-input logic gate, and wherein an output terminal of the 2-input logic gate in each preceding stage in the series is coupled to a first input terminal of the 3-input logic gate in a subsequent stage in the series, and wherein an output terminal of the 2-input logic gate in the Nth stage is coupled to a first input terminal of the 3-input logic gate in the first stage.

Clause 2. The frequency divider of clause 1, wherein the 2-input logic gates are cross-coupled to form N latches.

Clause 3. The frequency divider of any of clauses 1-2, wherein each three-input logic gate has a second input terminal coupled to a clock source.

Clause 4. The frequency divider of clause 3, wherein each stage's three-input logic gate has a third input terminal coupled to the output terminal of the 2-input terminal in another one of the stages.

Clause 5. A frequency divider, comprising:
a differential clock source configured to output a positive input clock signal and a negative input clock signal that is a complement of the positive input clock signal;
a plurality of N latches, wherein N is a plural positive integer greater than two;
a plurality of N first logic gates, each first logic gate having a first output terminal coupled to a reset input terminal of a corresponding one of the latches, each first logic gate being configured to process a unique pair of overlapping clock signals from a plurality of 2N overlapping clock signals with one of the positive input clock signal and the negative input clock signal to output, at the first output terminal, a corresponding non-overlapping clock signal from a first plurality of N non-overlapping clock signals; and
a plurality of N second logic gates, each second logic gate having a second output terminal coupled to a set input terminal of a corresponding one of the latches, each second logic gate being configured to process a unique pair of overlapping clock signals from the plurality of 2N overlapping clock signals with one of the positive input clock signal and the negative input clock signal to output, at the second output terminal, a corresponding non-overlapping clock signal from a second plurality of N non-overlapping clock signals.

Clause 6. The frequency divider of clause 5, wherein each latch in the plurality of N latches comprises a cross-coupled pair of logic gates.

Clause 7. The frequency divider of clause 6, wherein the cross-coupled pair of logic gates in each latch in the plurality of N latches comprises a cross-coupled pair of NOR gates.

Clause 8. The frequency divider of any of clauses 5-7, wherein the plurality of N first logic gates comprises a first plurality of N 3-input NOR gates.

Clause 9. The frequency divider of any of clauses 5-8, wherein the plurality of N second logic gates comprises a second plurality of N 3-input NOR gates.

Clause 10. The frequency divider of clause 8, wherein the first plurality of N 3-input NOR gates is arranged from a first 3-input NOR gate to an Nth 3-input NOR gate and the first plurality of N non-overlapping clock signal is arranged from a first non-overlapping clock signal to an Nth non-overlapping clock signal, and wherein the first 3-input NOR gate is configured to output the first non-overlapping clock signal, a second 3-input NOR gate is configured to output a second non-overlapping clock signal, and so on such that the Nth 3-input NOR gate is configured to output the Nth non-overlapping clock signal.

Clause 11. The frequency divider of clause 9, wherein the second plurality of N 3-input NOR gates is arranged from an (N+1)th 3-input NOR gate to an 2Nth 3-input NOR gate and the second plurality of N non-overlapping clock signal is arranged from an (N+1)th non-overlapping clock signal to a 2Nth non-overlapping clock signal, and wherein the (N+1)th 3-input NOR gate is configured to output the (N+1)th non-overlapping clock signal, an (N+2)th 3-input NOR gate is configured to output an (N+2)th non-overlapping clock signal, and so on such that the 2Nth 3-input NOR gate is configured to output the 2Nth non-overlapping clock signal.

Clause 12. The frequency divider of any of clauses 5-11, wherein N is an even integer greater than two.

Clause 13. The frequency divider of any of clauses 5-11, wherein N is an odd integer greater than two.

Clause 14. The frequency divider of any of clauses 5-11, wherein the frequency divider is incorporated into a cellular telephone.

Clause 15. A divide-by-N frequency divider, comprising:
a differential clock source configured to cycle a positive input clock signal and a negative input clock signal at a first frequency, wherein the negative input clock signal is a complement of the positive input clock signal;
a plurality of N latches, each latch being configured to output a corresponding pair of overlapping clock signals from 2N overlapping clock signals that cycle at a second frequency that is 1/Nth the first frequency and have approximately a 50% duty cycle, wherein N is an integer of 3 or greater; and
a plurality of 2N logic gates configured to output 2N non-overlapping clock signals that cycle at the second frequency and have approximately a (50/N) % duty cycle, each logic gate being configured to process two of the 2N overlapping clock signals with one of the negative input clock signal and the positive input clock signal to output a corresponding one of the 2N non-overlapping clock signals at an output terminal of the logic gate.

Clause 16. The divide-by-N frequency divider of clause 15, wherein N equals three, and wherein the second frequency is ⅓ the first frequency.

Clause 17. The divide-by-N frequency divider of clause 16, wherein the plurality of N latches comprises a first latch, a second latch, and a third latch, and wherein the plurality of 2N logic gates comprises:
a first logic gate having its output terminal coupled to a reset terminal of the first latch;
a second logic gate having its output terminal coupled to a set terminal of the first latch;
a third logic gate having its output terminal coupled to a reset terminal of the second latch;
a fourth logic gate having its output terminal coupled to a set terminal of the second latch;
a fifth logic gate having its output terminal coupled to a reset terminal of the third latch; and
a sixth logic gate having its output terminal coupled to a set terminal of the third latch.

Clause 18. The divide-by-N frequency divider of clause 17, wherein each logic gate comprises a 3-input NOR gate.

Clause 19. The divide-by-N frequency divider of clause 18, wherein the corresponding pair of overlapping clock signals of the first latch comprises a second overlapping clock signal and a fifth overlapping clock signal, the corresponding pair of overlapping clock signals of the second latch comprises a second overlapping clock signal and a fifth overlapping clock signal, and the corresponding pair of overlapping clock signals of the third logic gate comprises a first overlapping clock signal and a fourth overlapping clock signal.

Clause 20. The divide-by-N frequency divider of clause 15, wherein N equals four, and wherein the second frequency is ¼ the first frequency.

Clause 21. The divide-by-N frequency divider of clause 20, wherein the plurality of N latches comprises a first latch, a second latch, a fourth latch and a third latch, and wherein the plurality of 2N logic gates comprises
a first logic gate having its output terminal coupled to a reset terminal of the first latch;
a second logic gate having its output terminal coupled to a set terminal of the first latch;
a third logic gate having its output terminal coupled to a reset terminal of the second latch;
a fourth logic gate having its output terminal coupled to a set terminal of the second latch;
a fifth logic gate having its output terminal coupled to a reset terminal of the third latch;
a sixth logic gate having its output terminal coupled to a set terminal of the third latch;
a seventh logic gate having its output terminal coupled to a reset terminal of the fourth latch; and
an eighth logic gate having its output terminal coupled to a set terminal of the fourth latch.

Clause 22. The frequency divider of clause 21, wherein each logic gate comprises a 3-input NOR gate.

Clause 23. A method of frequency division, comprising:
dividing an input clock signal in frequency by a divisor N into a plurality of 2N overlapping clock signals; wherein N is an integer of three or greater and each overlapping clock signal has a duty cycle of approximately 50%; and
processing pairs of the overlapping clock signals with the input clock signal to divide the input clock signal in frequency by the divisor N into a plurality of 2N non-overlapping clock signals each having a duty cycle of approximately (50/N) %.

Clause 24. The method of clause 23, wherein processing each pair of the overlapping clock signals comprises a NOR of the pair of the overlapping clock signals with the input clock signal to output a corresponding non-overlapping clock signal from the plurality of 2N non-overlapping clock signals.

Clause 25. The method of clause 23, wherein the input clock signal is a differential input clock signal including a positive input clock signal and a negative output clock signal, and wherein the processing of each pair of the overlapping clock signals comprises a NOR of the overlapping clock signal with one of the positive input clock signal and the negative output signal.

Clause 26. The method of clause 24, wherein the overlapping clock signals in each pair of overlapping clock signals have a delay with respect to each other of (N+2) times one-half of a period of the input clock signal.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A frequency divider, comprising:
a plurality of stages arranged in series from a first stage to an Nth stage, wherein N is an integer of three or greater and each stage comprises:
a 3-input logic gate having an output terminal coupled to a first input terminal of a 2-input logic gate, and
wherein an output terminal of the 2-input logic gate in each preceding stage in the series is coupled to a first input terminal of the 3-input logic gate in a subsequent stage in the series, and wherein an output terminal of the 2-input logic gate in the Nth stage is coupled to a first input terminal of the 3-input logic gate in the first stage.

2. The frequency divider of claim 1, wherein the 2-input logic gates are cross-coupled to form N latches.

3. The frequency divider of claim 1, wherein each three-input logic gate has a second input terminal coupled to a clock source.

4. The frequency divider of claim 3, wherein each stage's three-input logic gate has a third input terminal coupled to the output terminal of the 2-input terminal in another one of the stages.

5. A frequency divider, comprising:
a differential clock source configured to output a positive input clock signal and a negative input clock signal that is a complement of the positive input clock signal;
a plurality of N latches, wherein N is a plural positive integer greater than two;
a plurality of N first logic gates, each first logic gate having a first output terminal coupled to a reset input terminal of a corresponding one of the latches, each first logic gate being configured to process a unique pair of overlapping clock signals from a plurality of 2N overlapping clock signals with one of the positive input clock signal and the negative input clock signal to output, at the first output terminal, a corresponding non-overlapping clock signal from a first plurality of N non-overlapping clock signals; and
a plurality of N second logic gates, each second logic gate having a second output terminal coupled to a set input terminal of a corresponding one of the latches, each second logic gate being configured to process a unique pair of overlapping clock signals from the plurality of 2N overlapping clock signals with one of the positive input clock signal and the negative input clock signal to output, at the second output terminal, a corresponding non-overlapping clock signal from a second plurality of N non-overlapping clock signals.

6. The frequency divider of claim 5, wherein each latch in the plurality of N latches comprises a cross-coupled pair of logic gates.

7. The frequency divider of claim 6, wherein the cross-coupled pair of logic gates in each latch in the plurality of N latches comprises a cross-coupled pair of NOR gates.

8. The frequency divider of claim 5, wherein the plurality of N first logic gates comprises a first plurality of N 3-input NOR gates.

9. The frequency divider of claim 5, wherein the plurality of N second logic gates comprises a second plurality of N 3-input NOR gates.

10. The frequency divider of claim 8, wherein the first plurality of N 3-input NOR gates is arranged from a first 3-input NOR gate to an Nth 3-input NOR gate and the first plurality of N non-overlapping clock signal is arranged from a first non-overlapping clock signal to an Nth non-overlapping clock signal, and wherein the first 3-input NOR gate is configured to output the first non-overlapping clock signal, a second 3-input NOR gate is configured to output a second non-overlapping clock signal, and so on such that the Nth 3-input NOR gate is configured to output the Nth non-overlapping clock signal.

11. The frequency divider of claim 9, wherein the second plurality of N 3-input NOR gates is arranged from an (N+1)th 3-input NOR gate to an 2Nth 3-input NOR gate and the second plurality of N non-overlapping clock signal is arranged from an (N+1)th non-overlapping clock signal to a 2Nth non-overlapping clock signal, and wherein the (N+1)th 3-input NOR gate is configured to output the (N+1)th non-overlapping clock signal, an (N+2)th 3-input NOR gate is configured to output an (N+2)th non-overlapping clock signal, and so on such that the 2Nth 3-input NOR gate is configured to output the 2Nth non-overlapping clock signal.

12. The frequency divider of claim 5, wherein N is an even integer greater than two.

13. The frequency divider of claim 5, wherein N is an odd integer greater than two.

14. The frequency divider of claim 5, wherein the frequency divider is incorporated into a cellular telephone.

15. A divide-by-N frequency divider, comprising:
  a differential clock source configured to cycle a positive input clock signal and a negative input clock signal at a first frequency, wherein the negative input clock signal is a complement of the positive input clock signal;
  a plurality of N latches, each latch being configured to output a corresponding pair of overlapping clock signals from 2N overlapping clock signals that cycle at a second frequency that is 1/Nth of the first frequency and have approximately a 50% duty cycle, wherein N is an integer of 3 or greater; and
  a plurality of 2N logic gates configured to output 2N non-overlapping clock signals that cycle at the second frequency and have approximately a (50/N) % duty cycle, each logic gate being configured to process two of the 2N overlapping clock signals with one of the negative input clock signal and the positive input clock signal to output a corresponding one of the 2N non-overlapping clock signals at an output terminal of the logic gate.

16. The divide-by-N frequency divider of claim 15, wherein N equals three, and wherein the second frequency is ⅓ the first frequency.

17. The divide-by-N frequency divider of claim 16, wherein the plurality of N latches comprises a first latch, a second latch, and a third latch, and wherein the plurality of 2N logic gates comprises:
  a first logic gate having its output terminal coupled to a reset terminal of the first latch;
  a second logic gate having its output terminal coupled to a set terminal of the first latch;
  a third logic gate having its output terminal coupled to a reset terminal of the second latch;
  a fourth logic gate having its output terminal coupled to a set terminal of the second latch;
  a fifth logic gate having its output terminal coupled to a reset terminal of the third latch; and
  a sixth logic gate having its output terminal coupled to a set terminal of the third latch.

18. The divide-by-N frequency divider of claim 17, wherein each logic gate comprises a 3-input NOR gate.

19. The divide-by-N frequency divider of claim 18, wherein the corresponding pair of overlapping clock signals of the first latch comprises a second overlapping clock signal and a fifth overlapping clock signal, the corresponding pair of overlapping clock signals of the second latch comprises a third overlapping clock signal and a sixth overlapping clock signal, and the corresponding pair of overlapping clock signals of the third logic gate comprises a first overlapping clock signal and a fourth overlapping clock signal.

20. The divide-by-N frequency divider of claim 15, wherein N equals four, and wherein the second frequency is ¼ the first frequency.

21. The divide-by-N frequency divider of claim 20, wherein the plurality of N latches comprises a first latch, a second latch, a fourth latch and a third latch, and wherein the plurality of 2N logic gates comprises
  a first logic gate having its output terminal coupled to a reset terminal of the first latch;
  a second logic gate having its output terminal coupled to a set terminal of the first latch;
  a third logic gate having its output terminal coupled to a reset terminal of the second latch;
  a fourth logic gate having its output terminal coupled to a set terminal of the second latch;
  a fifth logic gate having its output terminal coupled to a reset terminal of the third latch;
  a sixth logic gate having its output terminal coupled to a set terminal of the third latch;
  a seventh logic gate having its output terminal coupled to a reset terminal of the fourth latch; and
  an eighth logic gate having its output terminal coupled to a set terminal of the fourth latch.

22. The frequency divider of claim 21, wherein each logic gate comprises a 3-input NOR gate.

23. A method of frequency division, comprising:
  dividing an input clock signal in frequency by a divisor N into a plurality of 2N overlapping clock signals; wherein N is an integer of three or greater and each overlapping clock signal has a duty cycle of approximately 50%; and
  processing pairs of the overlapping clock signals with the input clock signal to divide the input clock signal in frequency by the divisor N into a plurality of 2N non-overlapping clock signals each having a duty cycle of approximately (50/N) %.

24. The method of claim 23, wherein processing each pair of the overlapping clock signals comprises a NOR of the pair of the overlapping clock signals with the input clock signal to output a corresponding non-overlapping clock signal from the plurality of 2N non-overlapping clock signals.

25. The method of claim 23, wherein the input clock signal is a differential input clock signal including a positive input clock signal and a negative output clock signal, and wherein the processing of each pair of the overlapping clock signals comprises a NOR of the overlapping clock signal with one of the positive input clock signal and the negative output signal.

26. The method of claim 24, wherein the overlapping clock signals in each pair of overlapping clock signals have a delay with respect to each other of (N+2) times one-half of a period of the input clock signal.

* * * * *